United States Patent

[11] 3,581,164

[72] Inventors Hans Pfander
Freiburg;
Harald Schilling, Gundelfingen; Gerhard
Schwabe, Freiburg, all of, Germany
[21] Appl. No. 834,428
[22] Filed June 18, 1969
[45] Patented May 25, 1971
[73] Assignee International Telephone and Telegraph
Corporation
Nutley, N.J.
[32] Priority June 26, 1968
[33] Germany
[31] P 17 64 556.6

[54] JUNCTION CAPACITANCE COMPONENT, ESPECIALLY FOR A MONOLITHIC MICROCIRCUIT
5 Claims, 3 Drawing Figs.

[52] U.S. Cl. .......... 317/234, 29/576
[51] Int. Cl. .......... H01l 5/00, H01l 7/02
[50] Field of Search .......... 317/234/9, 235/48, 235/48.1

[56] References Cited
UNITED STATES PATENTS

| | | | |
|---|---|---|---|
| 3,370,995 | 2/1968 | Lowery et al ............... | 317/235X |
| 3,388,012 | 6/1968 | Fallon ............... | 317/235X |
| 3,427,513 | 2/1969 | Hilbiber ............... | 317/235 |
| 3,443,176 | 5/1969 | Agusta et al. ............... | 317/235 |

*Primary Examiner*—James D. Kallam
*Attorneys*—C. Cornell Remsen, Jr., Walter J. Baum, Percy P. Lantzy, Philip M. Bolton, Isidore Togut and Charles L. Johnson, Jr.

ABSTRACT: This is a junction capacitance component which can be simultaneously formed with other planar transistors on a monolithic integrated circuit. The capacitance component achieves an improved specific capacity for the same voltage breakdown by forming an intermediate region between a wafer and an epitaxial layer, said layer containing a highly doped emitter region base and collector regions, and a highly doped region which extends from said emitter, through said base and collector to, and within the marginal area of, said intermediate region.

PATENTED MAY 25 1971 3,581,164

SHEET 1 OF 2

INVENTORS
HANS PFANDER
HARALD SCHILLING
GERHARD SCHWABE

BY Stephen A Young
ATTORNEY

INVENTORS
HANS PFANDER
HARALD SCHILLING
GERHARD SCHWABE

BY Stephen A. Young
ATTORNEY

JUNCTION CAPACITANCE COMPONENT, ESPECIALLY FOR A MONOLITHIC MICROCIRCUIT

CROSS REFERENCE TO RELATED APPLICATIONS

The subject matter of this application is generally related to that disclosed in copending U.S. application No. 826,146, filed May 20, 1969, H. Schilling-6, assigned to the assignee of the instant application.

BACKGROUND OF THE INVENTION

This invention relates to depletion layer capacitors, in particular for monolithic integrated circuits.

From the U.S. Pat. No. 3,350,760 it is known to utilize the space charge capacitance of PN junction areas as junction capacitance component in a monolithic microcircuit. From the article "Die Planartechnik bei Transistoren und integrierten Schaltungen" (planar technique as applied to transistors and integrated circuits) as published in the technical journal "Scientia Electrica", Vol. X, part 4 (1964) pages 97 to 122, it is also known to use the junction capacitance of the emitter-base junction or the collector-base junction of a planar transistor element in an integrated circuit, and if required, also in parallel arrangement, as a junction capacitance component.

The invention is based on the use of a planar transistor element as known from the last-mentioned passage of literature, as a junction capacitance component. In this conventional type of planar transistor element designed as a planar structure, and from one surface side of the semiconductor wafer which is provided with an epitaxial layer of a conductivity-type which is in opposition thereto, the emitter zone is inserted in the base zone, and both zones are inserted in the epitaxial layer by employing the generally known planar diffusion method. The collector zone extending to the PN junction between the epitaxial layer and the wafer, is electrically separated with respect to direct current from the neighboring elements of the monolithic microcircuit by a ring-shaped or annular isolating zone extending from the surface of the epitaxial layer to the water.

Accordingly, when using such a planar transistor element as a junction capacitance component within a monolithic microcircuit, the free PN junctions are available of which the emitter-base junction, owing to the relatively high doping of the base region on the emitter side, has the highest specific capacity (capacity per unit of the semiconductor surface area) and, in practice, a breakdown voltage of about 6 to 8 volts. For the purpose of increasing the specific capacity of such a planar transistor element capable of being used as a junction capacitance component and, consequently, for enabling a better utilization of the available semiconductor surface area, it has already been proposed, with respect to the diffusion processes during the manufacture of the microcircuit, to carry out an isolation diffusion in conjunction with a base diffusion and wherein the emitter zone is then diffused-in by way of planar diffusion. From this there will result a PN junction area extending from the wafer into the epitaxial layer, thus permitting a restricted use as a junction capacitance with respect to ground. When utilizing the insulating diffusion for manufacturing the junction capacitance component of a microcircuit, and without any special additional measures, there will result the disadvantage that the breakdown voltage is reduced owing to the special concentration conditions of the dopings.

The invention proceeds from the basic idea that the conventional type of planar transistor element as described hereinbefore, can be modified for use as a junction capacitance component, in such a way that there will result a increased specific capacity, in other words, a good utilization of the semiconductor surface area at a relatively high breakdown voltage of the junction capacitance component. Moreover, this modification shall be made in such a way, that, if possible, no more diffusion processes have to be carried out than are necessary for manufacturing the planar transistor elements within the same microcircuit. For this reason, in the following description, there are also used terms relating to planar transistor elements, such as "emitter diffusion," "base diffusion" and "isolation diffusion" for processes which are simultaneously carried out for manufacturing planar transistor elements positioned on the same semiconductor wafer (substrate). For the corresponding zones within the depletion layer capacitor the same terms such as "emitter zone" and "base zone" are used, although the subject matter of the present invention relates to junction capacitance components rather than to planar transistor elements. This, however, shall not be understood to restrict the invention to junction capacitance components which are only manufactured together with the corresponding zones of planar transistor elements within the same microcircuit (IC). It is also within the scope of the present invention to manufacture the zones of the junction capacitance components corresponding to the zones of planar transistor elements, in the course of more than one diffusion process, so that the depth and the concentration distributions of the zones can be modified in accordance with the required electrical values.

SUMMARY OF THE INVENTION

It is an object of this invention to provide a structure for a depletion layer capacitor having a relatively high specific capacity without reducing the breakdown voltage.

Another object is to produce a depletion layer capacitor following the steps of production used for manufacturing semiconductor elements, in particular transistor elements.

According to a broad aspect of this invention there is provided a junction capacitance component, having a planar structure, comprising a wafer of one conductivity type, a layer of opposite conductivity-type, one surface of said layer being attached to one surface of said wafer, an intermediate region of said opposite conductivity-type, said intermediate region formed within the marginal area of said layer at the interface between said layer and said wafer, a first region of said one conductivity-type formed within the opposite surface of said layer, a second region of said opposite conductivity-type formed within said first region, and a third region of said one conductivity-type, said third region extending from and within the marginal area of said intermediate region through said layer and first region to and within the marginal surface area of said second region.

Another feature of the invention provides for a junction capacitance component wherein said component is formed within a monolithic integrated circuit, further comprising a ring region of the same conductivity-type and approximately the same impurity concentration as said third region, said ring region surrounding said capacitance component and extending from said wafer to the opposite surface of said layer so as to form an electrical isolation barrier between said capacitance component and other electrical components of the monolithic integrated circuit.

Accordingly, since the third region forms a PN junction with the intermediate region, the capacitive component is electrically isolated from the wafer by this PN junction. In the absence of this intermediate region, the third region would extend directly into the wafer.

According to the invention, this third region causes an increased specific capacity without lowering the breakdown voltage of the junction capacitance component, because the diffusion of this third region results in a substantial increase in the doping concentration at the PN junction area between the second and third regions, which is determinative of the capacitance, without changing the doping concentration condition of the PN junction area between the first and second regions at the semiconductor surface. In fact, if the component did not contain the third region, the voltage breakdown for the device would occur at the surface portion of the PN junction between the first and second region when the device is reverse biased.

DESCRIPTION OF THE PREFERRED EMBODIMENTS

Figure 1:
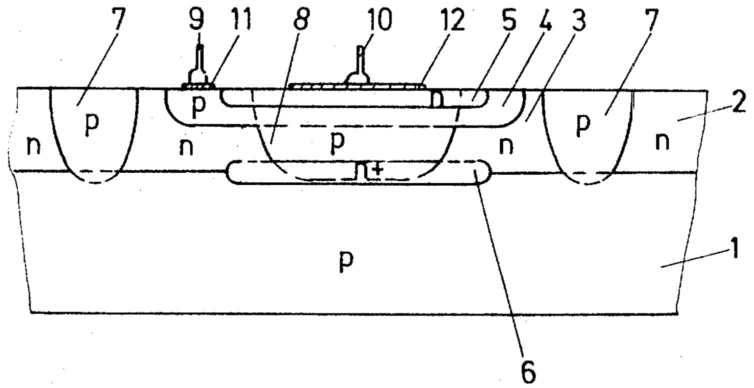
FIG. 1 shows a preferred type of embodiment of a junction capacitance component according to the invention.
Figure 2:
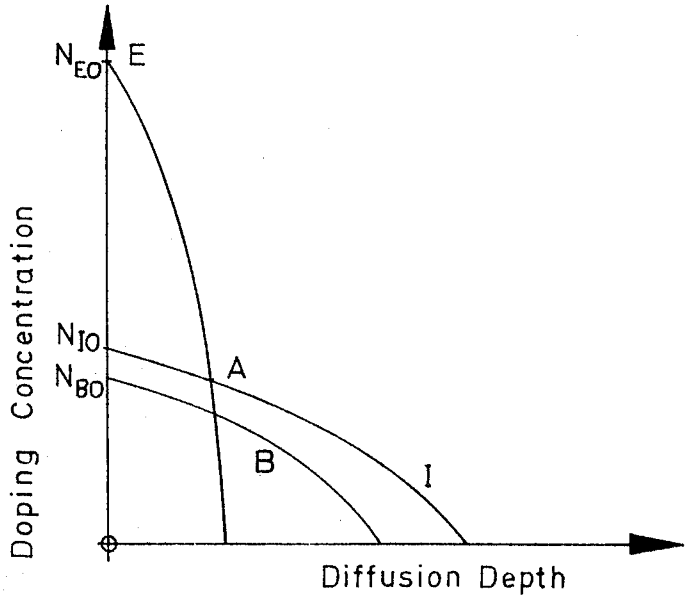
FIG. 2 serves to explain the relative doping conditions as the diffusion depth increases from the semiconductor surface.

In FIG. 2 the curve E indicates the impurity doping profile of the emitter region 6 of FIG. 1, wherein the doping concentration decreases with increasing depth of the emitter from the surface of layer 2 and $N_{EO}$ refers to the surface concentration. In the present example an N-doping impurity material, such as phosphorus, can be used to form the emitter region. Moreover, in FIG. 2 there are plotted relative to the curve E, the concentration impurity profile curves I and B for the respective isolating ring region 7 with the surface concentration $N_{IO}$, and the base region 4 with the surface concentration $N_{BO}$. The impurity profile for curve I is equivalent to the impurity profile of region 8 which can be formed simultaneously with ring region 7.

According to FIG. 2, the junction capacitance of the emitter-base junction is determined by the doping concentration conditions at a diffusion depth corresponding to the point of intersection of curve E with curve B, when region 8 is not formed. This additional diffusion of region 8 which being equivalent to isolating region 7, has an increased surface concentration and a greater diffusion depth than the diffused base region 4, as shown in FIG. 2. At the point of intersection "A" between the curve E and the curve I, hence at the PN junction area between region 8 and emitter region 5, there is an increased doping concentration and, consequently, an increased space charge capacitance over the PN junction area between regions 4 and 5. The breakdown voltage at the PN junction area between regions 4 and 5, which is substantially determined by the doping conditions existing at the semiconductor surface, is not reduced by having the emitter region 5 overlap region 8 at the entire margin thereof on the semiconductor surface as shown in FIG. 1, as long as a suitable impurity profile for curve I is selected. In addition thereto, base region 4 which in turn overlaps the emitter region 5 at the surface as shown in FIG. 1, is formed by diffusion in accordance with the curve B, so that the voltage breakdown is not reduced.

A junction capacitance component, according to FIG. 1, is manufactured as follows, using the well-known method of manufacturing epitaxial layers, and standard planar diffusion, masking and photolithographic techniques:

A wafer 1 typically silicon and of P-conductivity-type is the starting material. In accordance with the desired geometry of intermediate layer 6, highly doped and typically N+ conductivity-type, is diffused through a suitable mask into wafer 1. The oxide mask is removed and an epitaxial layer 2, typically N-conductivity-type, is deposited thereon and intermediate layer 6 assumes the shape as shown in FIG. 1 by expanding into layer 2. Isolating region 7 and region 8, both typically of P-conductivity-type, and both having the impurity profile as represented by curve I in FIG. 2 can then be simultaneously diffused through the surface of layer 2 so that region 7 contacts wafer 1 and region 8 contacts layer 6. The isolating region 7 can have a ring shape which completely surrounds the capacitance component so as to electrically separate said component from other components of a monolithic integrated circuit which can be formed in wafer 1. Base region 4, typically of P-conductivity type and having an impurity profile according to curve B, and emitter region 5, typically of N-conductivity-type and having an impurity profile according to curve E, both curves being relative to curve I, are both diffused into layer 2 as shown in FIG. 1 according to known standard masking and diffusion techniques. Base region 4 is thus formed within layer 2, with emitter region 5 being formed within the marginal area of region 4. Region 8 is formed within the marginal surface area of emitter 5 and extends from emitter region 5 through base region 4 and layer 2 to, and within the marginal area of, intermediate layer or region 6. That part of layer 2 between the isolating region 7 and both of regions 4 and 8 can be considered the collector 3 of the junction capacitance component and has the original N-conductivity of layer 2. The resulting junction capacitance component has gold wires 9 and 10 attached to the respective metal electrode layers 11 and 12 of the base and emitter regions respectively.

In order to obtain a maximum junction capacitance while not reducing breakdown voltage (e.g. normally $V_{EB}$=6 to 7 volts), when diffusing additional region 8, the breakdown voltage of the portion of the PN junction area lying between the emitter region 5 and the adjoining region 8, approaches the breakdown voltage at the semiconductor surface between emitter region 5 and base region 4, by having the impurity concentration at point A made equal to the surface impurity concentration ($N_{Bo}$) of base region 4. According to the invention, of course, the same may also be achieved by diffusing emitter region 5 sufficiently deeper into the additional region 8. Under certain circumstances, the breakdown voltage inside the semiconductor body, may be reduced below that on the semiconductor surface in cases where there is required a particularly high specific capacity and not a particularly high breakdown voltage.

Figure 3:
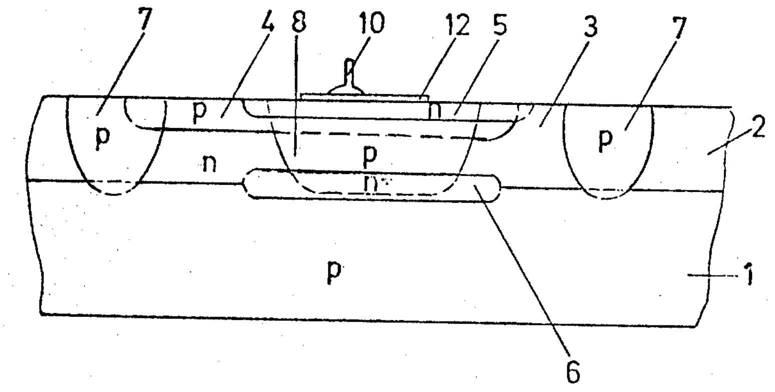
FIG. 3 shows a modified type of embodiment of a junction capacitance component according to the present invention, with an increased specific capacity.

FIG. 3 relates to a modified type of junction capacitance component according to the invention wherein both the emitter and base regions of the junction capacitance component need not be electrically isolated from wafer 1. In the junction capacitance component according to FIG. 3 the emitter region 5 partly overlaps the collector region 3, and the base region 4 partly overlaps the isolating region 7. A junction capacitance component according to FIG. 3 has an increased specific capacity with respect to the junction capacitance component according to FIG. 1, and corresponds to a parallel arrangement of all three PN junctions of a planar transistor element with one collector region serving as part of an epitaxial layer of the one conductivity type on a wafer of opposite conductivity-type, and with the conventional isolating region extending through the epitaxial layer to the wafer.

The idea of the invention is applicable in general whenever a junction capacitance component having a particularly high specific capacity, and a small semiconductor surface area is required. A junction capacitance component according to the present invention, for example, may also be used advantageously as an individual component in cases where the dimensions of a housing or casing, for example the diameter of a cylindrical housing for a varactor diode, is supposed to be kept small. Relative thereto it is easily possible to double the capacitance with respect to conventional types of junction capacitors without increasing the semiconductor surface area.

I claim:

1. A junction capacitance component having a planar structure comprising:
   - a wafer of one conductivity type;
   - a layer of opposite conductivity type, one surface of said layer being attached to one surface of said wafer;
   - an intermediate region of said opposite conductivity-type, said intermediate region formed within the marginal area of said layer at the interface between said layer and said wafer;
   - a first region of said one conductivity-type formed within the opposite surface of said layer;
   - a second region of said opposite conductivity-type formed within said first region; and
   - a third region of said one conductivity-type, said third region extending from and within the marginal area of said intermediate region through said layer and first region to and within the marginal surface area of said second region.